(12) United States Patent
Okada

(10) Patent No.: US 6,194,090 B1
(45) Date of Patent: Feb. 27, 2001

(54) ORGANIC ELECTROLUMINESCENCE DEVICE MATERIAL AND ORGANIC ELECTROLUMINESCENCE DEVICE USING THE SAME

(75) Inventor: Hisashi Okada, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/185,035

(22) Filed: Nov. 3, 1998

(30) Foreign Application Priority Data

Nov. 11, 1997 (JP) .................................... 9-308965

(51) Int. Cl.$^7$ .................................... H05B 33/14
(52) U.S. Cl. .................... 428/690; 428/704; 428/917; 313/504; 313/506
(58) Field of Search .................... 428/690, 704, 428/917; 313/504, 506; 548/262.4, 269.4

(56) References Cited

U.S. PATENT DOCUMENTS 5,486,406 * 1/1996 Shi ........................................ 428/209
5,779,937 * 1/1996 Sano et al. ...................... 252/301.16

OTHER PUBLICATIONS

Ryabukhin et al., "Preparation and study of transition metal complexes with di(o–hydroxyphenyl)–1,2,4–oxadiazole and 1,2,4–triazole.", Koord. Khim. 13(7), pp. 869–874, 1987 (no month).*

Antsyshkina et al., "Preparation and crystal structure of {2–[5–(1,3–diphenyl–1,2,4–triazolyl)]phenolato}zinc methanol.", Koord. Khim. 16(12), pp. 1628–1632, 1990 (no month).*

* cited by examiner

Primary Examiner—Marie Yamnitzky
(74) Attorney, Agent, or Firm—Sughrue, Mion, Zinn, Macpeak & Seas, PLLC

(57) ABSTRACT

An organic electroluminescence device material and an organic electroluminescence device containing the material. The organic electroluminescence device material is a metal complex of a compound represented by formula (I) and a metal ion:

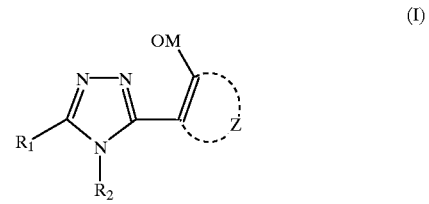

(I)

wherein $R_1$ represents a hydrogen atom or a substituent; $R_2$ represents a hydrogen atom, an aliphatic hydrocarbon group, an aryl group or a heterocyclic group; Z represents an atomic group necessary for forming a 5- or 6-membered ring; and M represents a hydrogen atom or a cation.

20 Claims, No Drawings

ORGANIC ELECTROLUMINESCENCE DEVICE MATERIAL AND ORGANIC ELECTROLUMINESCENCE DEVICE USING THE SAME

FIELD OF THE INVENTION

The present invention relates to a luminescent material for a light emitting device (organic electroluminescence (EL) device) capable of converting an electric energy into light and emitting light and to a light emitting device having a high luminance, more specifically, the present invention relates to a light emitting device suitably used in the field of display device, display, back light, electrophotography, illumination light source, mark, billboard, interior decoration and the like.

BACKGROUND OF THE INVENTION

At the present time, development and study on various display devices are aggressively driven. In particular, organic EL devices can obtain highly bright luminescence at a low voltage and accordingly, are drawing an attention as a promising display device. For example, an EL device comprising an organic thin film formed by depositing an organic compound is known (see, *Applied Physics Letters*, Vol. 51, page 913 (1987)). The organic EL device described in this publication has a laminate structure comprising an electron transporting material and a hole transporting material and is greatly improved in the luminescence properties as compared with conventional single-layer devices.

As a means to improve the luminescence efficiency of the laminate-type EL device, a method of doping a fluorescent dye is known. For example, an organic EL device having doped therein a coumarin dye described in *Journal of Applied Physics*, Vol. 65, page 3,610 (1989) is greatly improved in the luminescence efficiency as compared with non-doped devices. In this case, by changing the kind of the fluorescent compound, light having a desired wavelength can be taken out but compounds capable of highly efficiently emitting blue light and having superior durability are small in number.

Examples of the blue light emissive material for organic EL devices include condensed polycyclic aromatic compounds such as anthracene, pyrene and perylene (compounds described, for example, in *J. Chem. Phys.*, 44, 2902 (1966), and *Thin Solid Films*, 99, 171 (1982)), tetraphenylbutadiene-based compounds (compounds described, for example, in JP-A-59-194393 (the term "JP-A" as used herein means an "unexamined published Japanese patent application")), distyrylbenzene-based compounds (compounds described, for example, in European Patents 281381, 319881 and 373582, U.S. Pat. Nos. 4,672,265, 4,725,531, 4,734,338, 4,741,976 and 4,776,320, JP-A-61-37890, JP-A-1-245087, JP-A-2-247277, JP-A-2-247278, JP-A-2-209988, JP-A-3-33184, JP-A-3-84089, JP-A-3-231970, JP-A-4-117485, JP-A-4-275268, JP-A-5-17765 and JP-A-140145), stilbene-based compounds (compounds described, for example, in JP-A-2-235983 and JP-A-3-47890), polyphenyl-based compounds (compounds described, for example, in JP-A-3-33183), polycarbonate-based compounds containing an aromatic tertiary amine skeleton as a repeating unit (compounds described, for example, in JP-A-5-247459), metal complexes having a tropolone skeleton (compounds described, for example, in JP-A-9-157642), and metal complexes having a 2-(o-hydroxyphenyl)benzoxazole derivative or 2-(o-hydroxyphenyl)-thiazole derivative as a ligand (compounds described, for example, in JP-A-7-133483, JP-A-8-113576, JP-A-8-301877 and JP-A-8-306489). However, these compounds are disadvantageous in that the luminescence efficiency is low, the durability has a problem and the color purity is bad, thus, cannot be used in practice.

Of organic EL devices, devices in which an organic substance is laminated by vacuum deposition can successfully achieve highly bright luminescence, however, in view of simplification of the production process, workability and the like or for obtaining a large area, the device is preferably fabricated by a coating method. The devices fabricated by the conventional coating method are, however, inferior in the luminance of light emitted and the luminescence efficiency to the devices fabricated by the deposition method. Thus, improvements are still in need for attaining high luminance and highly efficient luminescence.

SUMMARY OF THE INVENTION

An object of the present invention is to provide an organic EL device material ensuring high color purity, being capable of achieving highly bright and highly efficient luminescence by the driving at a low voltage and having excellent stability on repeated use.

Another object of the present invention is to provide an organic EL device using the organic EL device material.

These objects have been attained by the following techniques.

(1) An organic electroluminescence device material which is a metal complex synthesized from a compound represented by the following formula (I) and a metal ion:

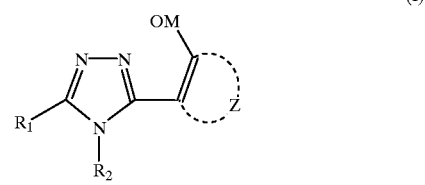

(wherein $R_1$ represents a hydrogen atom or a substituent, $R_2$ represents a hydrogen atom, an aliphatic hydrocarbon group, an aryl group or a heterocyclic group, Z represents an atomic group necessary for forming a 5- or 6-membered ring, and M represents a hydrogen atom or a cation).

(2) The organic electroluminescence device material as described in (1) above, wherein the metal ion of the metal complex is a divalent or trivalent cation.

(3) The organic electroluminescence element material as described in (1) or (2) above, wherein the metal ion of the metal complex is $Be^{2+}$, $Mg^{2+}$, $Al^{3+}$, $Ga^{3+}$ or $Zn^{2+}$.

(4) An organic electroluminescence device comprising a pair of electrodes having formed therebetween a light emitting layer or a plurality of organic compound thin films including a light emitting layer, wherein at least one layer comprises the organic electroluminescence device material described in (1) to (3) above.

(5) The organic electroluminescence device comprising a pair of electrodes having formed therebetween a light emitting layer or a plurality of organic compound thin films including a light emitting layer, wherein at least one layer comprises a polymer having dispersed therein the organic electroluminescence device material described in (1) to (3) above.

DETAILED DESCRIPTION OF THE INVENTION

The present invention is described in detail below.

Formula (1) is described below.

$R_1$ represents a hydrogen atom or a substituent. Examples of the substituent represented by $R_1$ include an alkyl group (preferably having from 1 to 20 carbon atoms, more preferably from 1 to 12 carbon atoms, still more preferably from 1 to 8 carbon atoms, e.g., methyl, ethyl, iso-propyl, tert-butyl, n-octyl, n-decyl, n-hexadecyl, cyclopropyl, cyclopentyl, cyclohexyl), an alkenyl group (preferably having from 2 to 20 carbon atoms, more preferably from 2 to 12 carbon atoms, still more preferably from 2 to 8 carbon atoms, e.g., vinyl, allyl, 2-butenyl, 3-pentenyl), an alkynyl group (preferably having from 2 to 20 carbon atoms, more preferably from 2 to 12 carbon atoms, still more preferably from 2 to 8 carbon atoms, e.g., propargyl, 3-pentynyl), an aryl group (preferably having from 6 to 30 carbon atoms, more preferably from 6 to 20 carbon atoms, still more preferably from 6 to 12 carbon atoms, e.g., phenyl, p-methylphenyl, naphthyl), an amino group (preferably having from 0 to 20 carbon atoms, more preferably from 0 to 10 carbon atoms, still more preferably from 0 to 6 carbon atoms, e.g., amino, methylamino, dimethyl-amino, diethylamino, dibenzylamino), an alkoxy group (preferably having from 1 to 20 carbon atoms, more preferably from 1 to 12 carbon atoms, still more preferably from 1 to 8 carbon atoms, e.g., methoxy, ethoxy, butoxy), an aryloxy group (preferably having from 6 to 20 carbon atoms, more preferably from 6 to 16 carbon atoms, still more preferably from 6 to 12 carbon atoms, e.g., phenyloxy, 2-naphthyloxy), an acyl group (preferably having from 1 to 20 carbon atoms, more preferably from 1 to 16 carbon atoms, still more preferably from 1 to 12 carbon atoms, e.g., acetyl, benzoyl, formyl, pivaloyl), an alkoxycarbonyl group (preferably having from 2 to 20 carbon atoms, more preferably from 2 to 16 carbon atoms, still more preferably from 2 to 12 carbon atoms, e.g., methoxycarbonyl, ethoxycarbonyl), an aryloxycarbonyl group (preferably having from 7 to 20 carbon atoms, more preferably from 7 to 16 carbon atoms, still more preferably from 7 to 10 carbon atoms, e.g., phenyloxycarbonyl), an acyloxy group (preferably having from 2 to 20 carbon atoms, more preferably from 2 to 16 carbon atoms, still more preferably from 2 to 10 carbon atoms, e.g., acetoxy, benzoyloxy), an acylamino group (preferably having from 2 to 20 carbon atoms, more preferably from 2 to 16 carbon atoms, still more preferably from 2 to 10 carbon atoms, e.g., acetylamino, benzoylamino), an alkoxycarbonylamino group (preferably having from 2 to 20 carbon atoms, more preferably from 2 to 16 carbon atoms, still more preferably from 2 to 12 carbon atoms, e.g., methoxycarbonylamino), an aryloxycarbonylamino group (preferably having from 7 to 20 carbon atoms, more preferably from 7 to 16 carbon atoms, still more preferably from 7 to 12 carbon atoms, e.g., phenyloxycarbonylamino), a sulfonylamino group (preferably having from 1 to 20 carbon atoms, more preferably from 1 to 16 carbon atoms, still more preferably from 1 to 12 carbon atoms, e.g., methanesulfonylamino, benzenesulfonylamino), a sulfamoyl group (preferably having from 0 to 20 carbon atoms, more preferably from 0 to 16 carbon atoms, still more preferably from 0 to 12 carbon atoms, e.g., sulfamoyl, methylsulfamoyl, dimethylsulfamoyl, phenylsulfamoyl), a carbamoyl group (preferably having from 1 to 20 carbon atoms, more preferably from 1 to 16 carbon atoms, still more preferably from 1 to 12 carbon atoms, e.g., carbamoyl, methylcarbamoyl, diethylcarbamoyl, phenylcarbamoyl), an alkylthio group (preferably having from 1 to 20 carbon atoms, more preferably from 1 to 16 carbon atoms, still more preferably from 1 to 12 carbon atoms, e.g., methylthio, ethylthio), an arylthio group (preferably having from 6 to 20 carbon atoms, more preferably from 6 to 16 carbon atoms, still more preferably from 6 to 12 carbon atoms, e.g., phenylthio), a sulfonyl group (preferably having from 1 to 20 carbon atoms, more preferably from 1 to 16 carbon atoms, still more preferably from 1 to 12 carbon atoms, e.g., mesyl, tosyl), a sulfinyl group (preferably having from 1 to 20 carbon atoms, more preferably from 1 to 16 carbon atoms, still more preferably from 1 to 12 carbon atoms, e.g., methanesulfinyl, benzenesulfinyl), a ureido group (preferably having from 1 to 20 carbon atoms, more preferably from 1 to 16 carbon atoms, still more preferably from 1 to 12 carbon atoms, e.g., ureido, methylureido, phenylureido), a phosphonamido group (preferably having from 1 to 20 carbon atoms, more preferably from 1 to 16 carbon atoms, still more preferably from 1 to 12 carbon atoms, e.g., diethylphosphonamido, phenylphosphonamido), a hydroxy group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group and a heterocyclic group (e.g., imidazolyl, pyridyl, furyl, piperidyl, morpholino). These substituents each may further be substituted.

The substituent is preferably an alkyl group, an alkenyl group, an aralkyl group, an aryl group or an aromatic heterocyclic group, more preferably an aryl group, a 5- or 6-membered aromatic heterocyclic group, still more preferably phenyl, naphthyl, pyrenyl, pyridyl, furyl, thienyl or pyrazinyl.

$R_1$ is preferably phenyl or naphthyl.

$R_2$ represents a hydrogen atom, an aliphatic hydrocarbon group, an aryl group or a heterocyclic group. The aliphatic hydrocarbon group represented by $R_2$ is a linear, branched or cyclic alkyl group (preferably having from 1 to 30 carbon atoms, more preferably from 1 to 20 carbon atoms, still more preferably from 1 to 12 carbon atoms, e.g., methyl, ethyl, iso-propyl, tert-butyl, n-octyl, n-decyl, n-hexadecyl, cyclopropyl, cyclopentyl, cyclohexyl), an alkenyl group (preferably having from 2 to 30 carbon atoms, more preferably from 2 to 20 carbon atoms, still more preferably from 2 to 12 carbon atoms, e.g., vinyl, allyl, 2-butenyl, 3-pentenyl) or an alkynyl group (preferably having from 2 to 30 carbon atoms, more preferably from 2 to 20 carbon atoms, still more preferably from 2 to 12 carbon atoms, e.g., propargyl, 3-pentynyl), preferably an alkyl group or an alkenyl group, more preferably methyl, ethyl propyl, butyl or allyl.

The aryl group represented by $R_2$ is preferably a monocyclic or bicyclic aryl group having from 6 to 30 carbon atoms (e.g., phenyl, naphthyl), more preferably phenyl having from 6 to 20 carbon atoms, still more preferably phenyl having from 6 to 12 carbon atoms.

The heterocyclic group represented by $R_2$ is a 3-, 4-, 5-, 6-, 7-, 8-, 9- or 10-membered, saturated or unsaturated heterocyclic ring containing at least one of N, O and S atoms. The ring may be a monocyclic ring or may form a condensed ring together with another ring.

The heterocyclic group is preferably a 5- or 6-membered aromatic heterocyclic group, more preferably a 5- or 6-membered aromatic heterocyclic group containing a nitrogen atom, still more preferably a 5- or 6-membered aromatic heterocyclic group containing one or two nitrogen atoms.

Specific examples of the heterocyclic ring include pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylidine, quinoxaline and quinazoline. The heterocyclic ring is preferably pyridine, pyrazine, pyridazine, triazine, indole, indazole, thiadiazole, oxadiazole, quinoline, phthalazine, quinoxaline, quinazoline or thiazole, more preferably pyridine, pyrazine, pyridazine, triazine, indole, indazole, thiadiazole, oxadiazole, quinoline or thiazole, still more preferably pyridine or quinoline.

The aliphatic hydrocarbon group, the aryl group or the heterocyclic group represented by $R_2$ may have a substituent and examples of the substituent include those described as the substituent of $R_1$.

$R_2$ is preferably an alkyl group, an alkenyl group, an aralkyl group, an aryl group or an aromatic heterocyclic group, more preferably an aryl group or a 5- or 6-membered aromatic heterocyclic group, still more preferably phenyl, naphthyl, pyrenyl, pyridyl, furyl, thienyl or pyrazinyl.

$R_2$ is more preferably phenyl.

Z represents an atomic group necessary for forming a 5- or 6-membered ring. The ring including Z may have a substituent (examples of the substituent include those described above as the substituent represented by $R_1$) or may be condensed with another ring.

Examples of the ring including Z include cyclopentene, cyclohexene, benzene, naphthalene, anthracene, phenanthrene, pyrene, perylene, pyridine, quinoline, furan, thiophene, pyrazine, pyrimidine, thiazole, benzothiazole, naphthothiazole, oxazole, benzoxazole, naphthoxazole, isooxazole, selenazole, benzoselenazole, naphthoselenazole, imidazole, benzimidazole, naphthimidazole, isoquinoline, quinoxaline and pyrazole.

The ring formed by Z is preferably benzene, naphthalene, pyridine, quinoline, furan, thiophene, pyrazine or pyrimidine, more preferably benzene, naphthalene, pyridine or quinoline, still more preferably benzene or naphthalene, and most preferably benzene.

M represents a hydrogen atom or a cation. The cation represented by M may be either an organic cation or an inorganic cation and examples thereof include ammonium (e.g., tetraethylammonium), phosphonium (e.g., tetraethylphosphonium) and alkali metal ion (e.g., $Li^+$, $Na^+$, $K^+$). M is preferably a hydrogen atom.

Among the compounds represented by formula (I), preferred is the compound represented by formula (I-a):

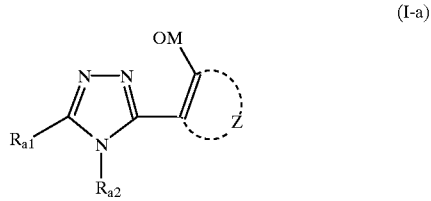

(I-a)

(wherein Z and M each has the same meaning as defined in formula (I) and the preferred ranges thereof are also the same; and $R_{a1}$ and $R_{a2}$ each represents an aryl group having the same meaning as the aryl group represented by $R_1$ or $R_2$ in formula (I) and the preferred range of the aryl group is also the same).

Among the compounds represented by formula (I), more preferred is the compound represented by formula (I-b):

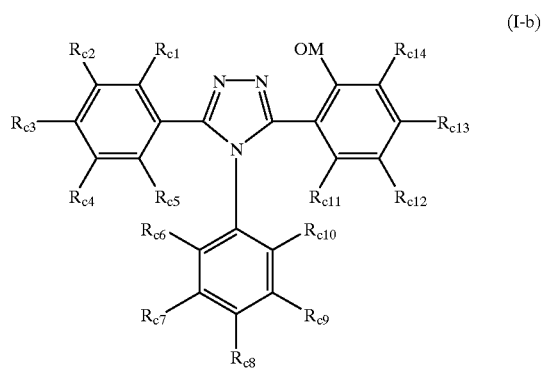

(I-b)

(wherein M has the same meaning as M in formula (I) and the preferred range thereof is also the same; $R_{c1}$ to $R_{c14}$ each represents a hydrogen atom or a substituent and examples of the substituent represented by $R_{c1}$, $R_{c2}$, $R_{c3}$, $R_{c4}$, $R_{c5}$, $R_{c6}$, $R_{c7}$, $R_{c8}$, $R_{c9}$, $R_{c10}$, $R_{c11}$, $R_{c12}$, $R_{c13}$ or $R_{c14}$ include those described above as the substituent represented by $R_1$ in formula (I)).

The compound represented by formula (I) may be a low molecular weight compound, a high molecular weight compound in which a residue represented by formula (I) is connected to the polymer main chain, or a high molecular weight compound having the skeleton of formula (I) in the main chain. The high molecular weight compound may be a homopolymer or a copolymer with another monomer.

For the sake of convenience, formula (I) is shown as a canonical structure but tautomers thereof may also be used.

The metal ion of the metal complex having the compound represented by formula (I) as a ligand is preferably a divalent or trivalent cation, more preferably $Be^{2+}$, $Mg^{2+}$, $Al^{3+}$, $Ga^{3+}$ or $Zn^{2+}$, still more preferably $Al^{3+}$ or $Zn^{2+}$, and most preferably $Zn^{2+}$.

Examples of the metal complex having the compound represented by formula (I) as a ligand are set forth below, however, the present invention is by no means limited thereto.

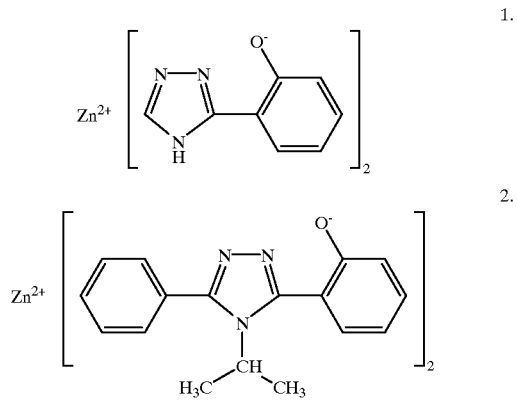

3.
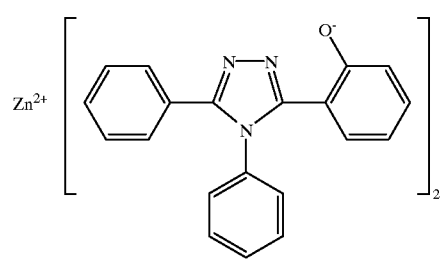
4.
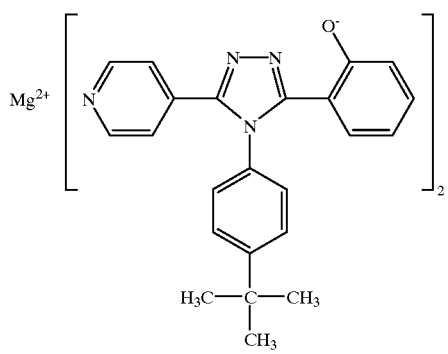
5.
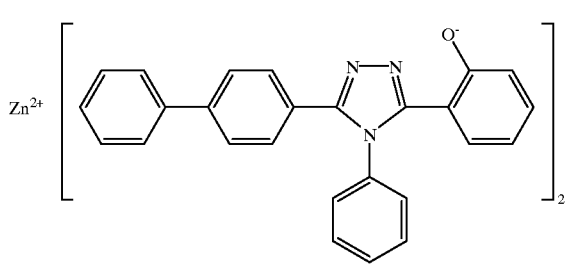
6.
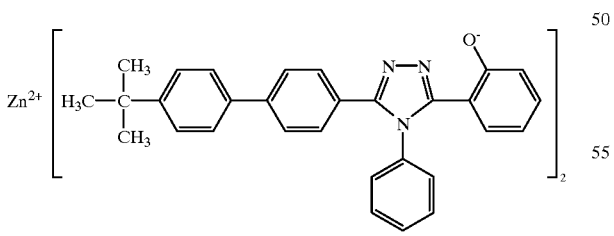
7.
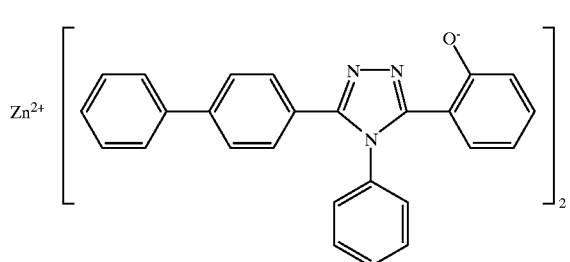
8.
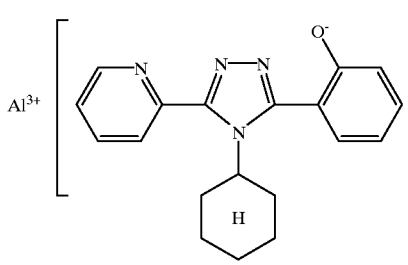
9.
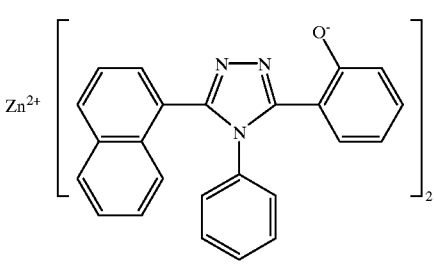
10.
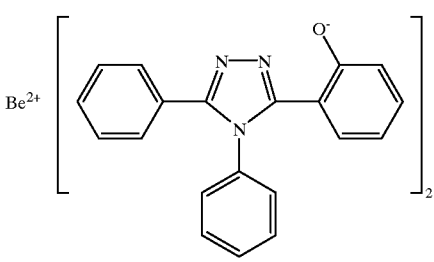
11.
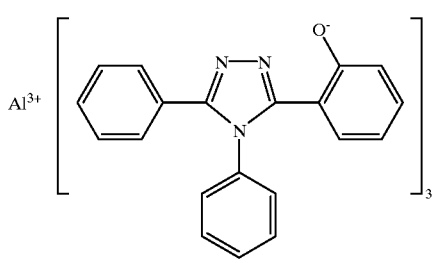

-continued

12.
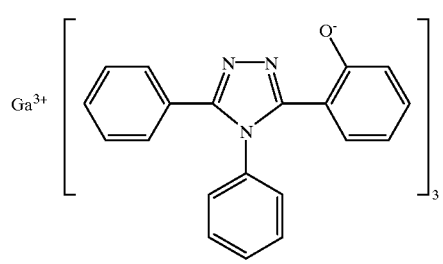

13.
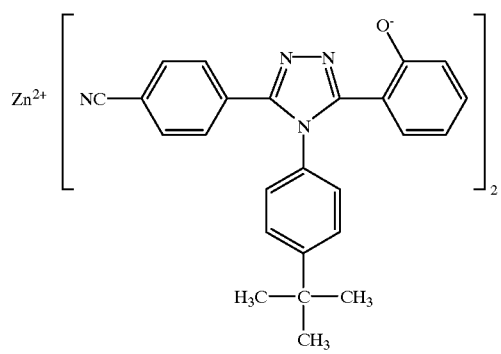

14.
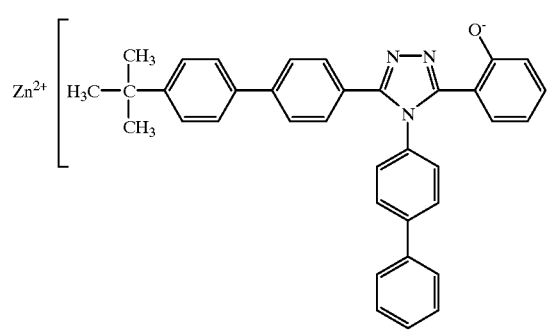

15.
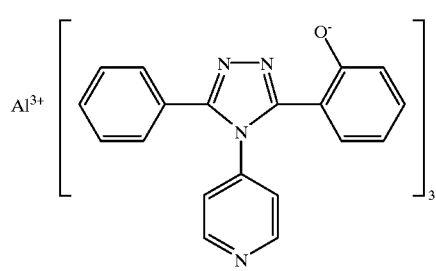

16.
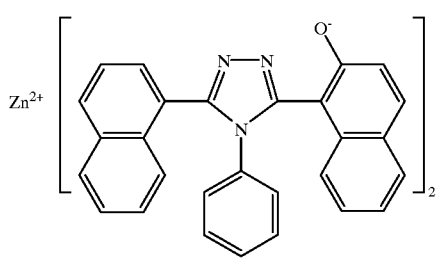

-continued

17.
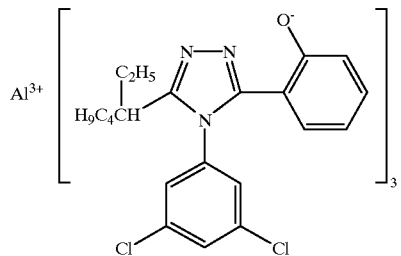

18.
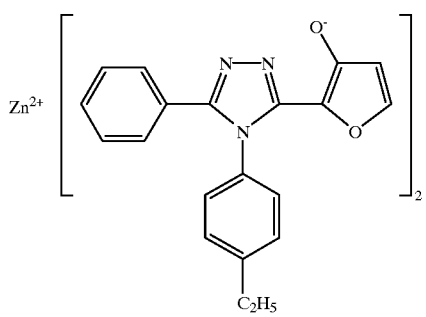

19.
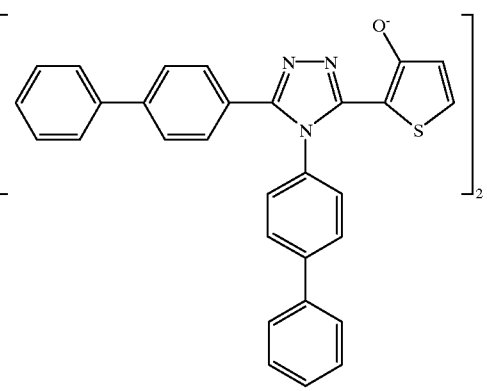

20.
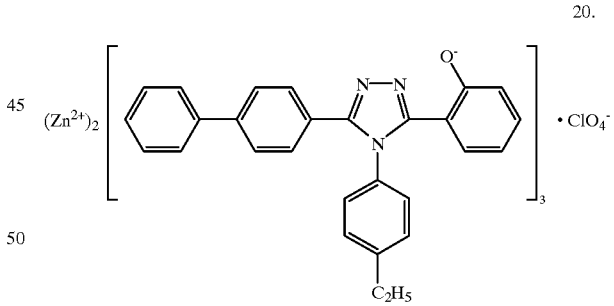

The compound represented by formula (I) of the present invention may be synthesized by various methods, for example, by the reaction (1) of a N,N-diacylhydrazine compound with an amine compound or (2) 1,3,4-oxadiazole with an amine compound. The metal complex of the present invention can be synthesized from the compound represented by formula (I) and a metal salt of various types.

The metal salt is not particularly limited, however, it is preferably a halogen salt such as nitrate and hydrochloride, a carboxylate such as sulfate and acetate, a phosphonate, a sulfonate or a hydroxide, more preferably nitrate, hydrochloride, sulfate or acetate.

The molar ratio of the compound represented by formula (I) to the metal salt used in the synthesis of a metal complex may be appropriately selected according to the complex synthesized, however, the ratio of the compound represented by formula (I) to the metal ion is usually from 0.1 to 10 molar times, preferably from 0.5 to 8 molar times, more preferably from 1 to 6 molar times.

In the synthesis of metal complex, a solvent may be used. The solvent is not particularly limited but examples of the solvent which can be used include water, alcohols (e.g., methanol, ethanol, 2-propanol), esters (e.g., ethyl acetate) ethers (e.g., diethyl ether, tetrahydrofuran, 1,4-dioxane) amides (e.g., dimethylformamide, dimethylacetamide), nitrile (e.g., acetonitrile), ketones (e.g., acetone, cyclohexanone), hydrocarbons (e.g., hexane, benzene, toluene), halogenated hydrocarbons (e.g., dichloromethane, chloroform, 1,2-dichloroethane) and carboxylic acids (e.g., acetic acid). These solvents may be used in combination. The solvent is preferably an alcohol, an ether or a ketone, more preferably an alcohol, still more preferably methanol, ethanol or 2-propanol.

The reaction temperature at the time of synthesizing a metal complex is not particularly limited, however, it is preferably from 10 to 150° C., more preferably from 10 to 100° C., still more preferably from 10 to 80° C.

A specific example of the synthesis method of the metal complex is as follows.

SYNTHESIS EXAMPLE

Synthesis of Compound 3
Synthesis Scheme

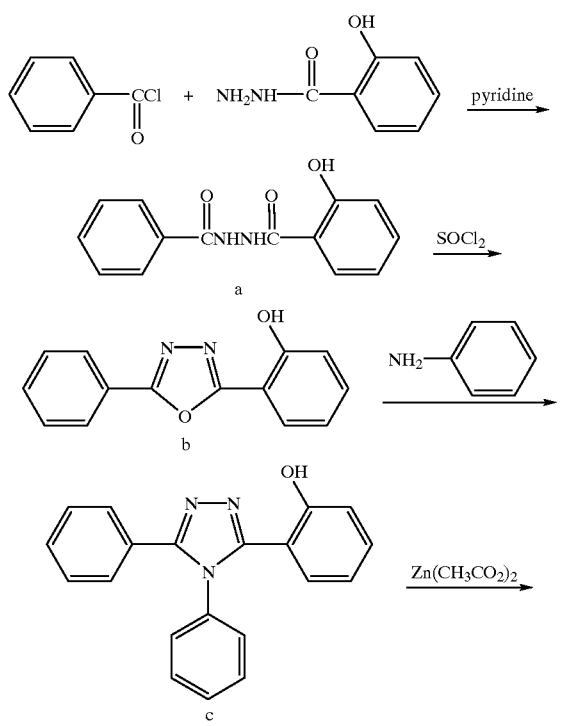

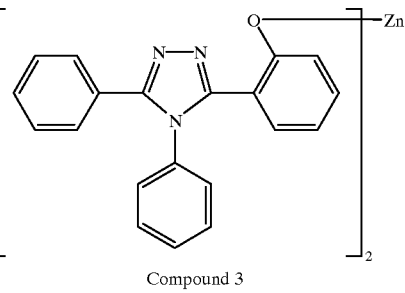

Compound 3

Synthesis of Compound a 15.2 g (0.10 mol) of salicylhydrazide was dissolved in 3 ml of dimethyl acetamide and 10 ml of acetonitrile. To the resulting mixed solution under stirring at a temperature of approximately from 0 to 5° C. in a nitrogen atmosphere, 17.4 g (0.22 mol) of pyridine was added and further, 15.5 g (0.11 mol) of benzoyl chloride was added dropwise while keeping the internal temperature at 10° C. or less. After completion of the dropwise addition, the solution was gradually heated to room temperature and then stirred for one hour. Thereafter, the reaction solution obtained was poured into diluted hydrochloric acid solution and the solids precipitated were collected by filtration. The solids collected were washed with water and methanol, as a result, 18.2 g of Compound a was obtained. Yield: 71%.

Synthesis of Compound b

To 30 ml of thionyl chloride under stirring at room temperature, 13.9 g (0.0542 mol) of Compound a was added little by little. The resulting solution was heated at 70° C., stirred for 4 hours and then cooled to room temperature. The reaction solution obtained was slowly poured into ice water and the solids precipitated were collected by filtration. The solids obtained were dissolved in ethyl acetate and dried over anhydrous magnesium sulfate. After removing the desiccating agent by filtration, the solvent was concentrated and recrystallized from ethyl acetate/n-hexane, as a result, 8.9 g of Compound b was obtained. Yield: 69%.

Synthesis of Compound c 4.77 g (0.02 mol) of Compound b, 2.8 g (0.03 mol) of aniline and 1.0 g (5.81 mmol) of p-toluenesulfonic acid were dissolved in 15 ml of o-dichlorobenzene and the mixed solution obtained was stirred under heating at 150° C. for 8 hours in a nitrogen atmosphere. Then, the solution was cooled to room temperature and concentrated under reduced pressure and the concentrate was extracted by chloroform/water. The organic layer was washed with brine and dried over anhydrous magnesium sulfate, the solvent was distilled off and the residue was recrystallized from acetonitrile. As a result, 2.1 g of Compound c was obtained. Yield: 32%.

Synthesis of Compound 3

1.40 g (4.25 mmol) of Compound c was dissolved under heating in 50 ml of methanol and to the resulting solution under reflux-stirring, a solution containing 444 mg (2.02 mmol) of zinc acetate dihydrate and 3 ml of methanol was added dropwise. After one hour, the reaction solution was concentrated to about ⅓ and allowed to stand in a refrigerator over night. The solids precipitated were collected by filtration and washed with cooled methanol. Then, 540 mg of Compound 3 was obtained as a white solid. Yield: 39%.

The EL device containing the metal complex of the present invention is described below. The method for forming an organic layer of an EL device containing the metal complex of the present invention is not particularly limited, however, a resistance heating evaporation method, an electron beam method, a sputtering method, a molecular lamination method and a coating method may be used and in view of properties and production, a resistance heating evaporation method and a coating method are preferred.

The metal complex of the present invention is preferably used as an electron transporting agent or a light emitting agent, more preferably as a light emitting agent, still more preferably as a blue light emitting agent.

The light emitting device of the present invention is a device comprising a pair of an anode and a cathode having formed therebetween a light emitting layer or a plurality of organic compound thin films including a light emitting layer. In addition to the light emitting layer, the device may comprise a hole injecting layer, a hole transporting layer, an electron injecting layer, an electron transporting layer and a protective layer. These layers each may have another function. For forming respective layers, various materials can be used.

The anode feeds holes to the hole injecting layer, the hole transporting layer or the light emitting layer. A metal, an alloy, a metal oxide, an electrically conductive compound or a mixture thereof may be used therefor, and a material having a work function of 4 eV or more is preferred. Specific examples thereof include an electrically conductive metal oxide such as tin oxide, zinc oxide, indium oxide and indium tin oxide (ITO), a metal such as gold, silver, chromium and nickel, a mixture or laminate of the metal with the electrically conductive metal oxide, an inorganic electrically conductive material such as copper iodide and copper sulfide, an organic electrically conductive material such as polyaniline, polythiophene and polypyrrole, and a laminate of the material with ITO. Of these, an electrically conductive metal oxide is preferred and in view of productivity, high electrical conductivity and transparency, ITO is more preferred. The thickness of the anode may be freely decided depending on the material used, however, it is usually in the range of preferably from 10 nm to 5 μm, more preferably from 50 nm to 1 μm, still more preferably from 100 nm to 500 nm.

The anode is usually used as a layer formed on a soda lime glass, an alkali-free glass or a transparent resin substrate. In the case of using a glass, the constructive material therefor is preferably an alkali-free glass so as to reduce the ion dissolved out from the glass. In the case of using a soda lime glass, the glass is preferably subjected to barrier coating with silica or the like. The thickness of the substrate is not particularly limited as far as the substrate can maintain the mechanical strength, however, in the case of using a glass, it is usually 0.2 mm or more, preferably 0.7 mm or more.

The anode may be prepared by various methods according to the material used and for example, in the case of ITO, the film is formed by an electron beam method, a sputtering method, a resistance heating evaporation method, a chemical reaction method (sol-gel process) or a method of coating an indium tin oxide dispersion.

By subjecting the anode to rinsing or other treatments, the device driving voltage can be lowered or luminescence efficiency can be increased. For example, in the case of ITO, UV-ozone treatment and plasma treatment are effective.

The cathode feeds electrons to the electron injecting layer, the electron transporting layer or the light emitting layer and is selected by taking account of the adhesion to the layer adjacent to the negative electrode, such as an electron injecting layer, an electron transporting layer and a light emitting layer, the ionization potential and the stability. As the material for the cathode, a metal, an alloy, a metal oxide, an electrically conductive compound or a mixture thereof may be used and specific examples thereof include an alkali metal (e.g., Li, Na, K) and a fluoride thereof, an alkaline earth metal (e.g., Mg, Ca) and a fluoride thereof, gold, silver, lead, aluminum, a sodium-potassium alloy or mixed metal, a lithium-aluminum alloy or mixed metal, a magnesium-silver alloy or mixed metal, and a rare earth metal such as indium and ytterbium. Of these, materials having a work function of 4 eV or less are preferred, and aluminum, a lithium-aluminum alloy or mixed metal and a magnesium-silver alloy or mixed metal are more preferred. The thickness of the cathode may be freely selected depending on the material used, however, it is usually in the range of preferably from 10 nm to 5 μm, more preferably from 50 nm to 1 μm, still more preferably from 100 nm to 1 μm.

The cathode may be prepared by an electron beam method, a sputtering method, a resistance heating evaporation method or a coating method, and a sole metal may be deposited or two or more components may be simultaneously deposited. Furthermore, a plurality of metals may be simultaneously deposited to form an alloy electrode or an alloy previously prepared may be deposited.

The anode and the cathode each preferably has a low sheet resistance of hundreds of Ω/□ or less.

The material for the light emitting layer may be any as far as it can form a layer having a function of injecting holes from the anode, hole injecting layer or hole transporting layer and at the same time injecting electrons from the cathode, electron injecting layer or electron transporting layer upon application of an electric field, a function of transferring charges injected, or a function of offering a chance such that the hole and the electron recombine and emit light. The light emitting layer preferably contains a metal complex of the present invention but a light emitting material other than the metal complex of the present invention may also be used. Examples thereof include various metal complexes including metal complexes and rare earth complexes such as benzoxazole derivative, benzimidazole derivative, benzothiazole derivative, styrylbenzene derivative, polyphenyl derivative, diphenylbutadiene derivative, tetraphenylbutadiene derivative, naphthalimide derivative, coumarin derivative, perylene derivative, perynone derivative, oxadiazole derivative, aldazine derivative, pyralidine derivative, cyclopentadiene derivative, bisstyrylanthracene derivative, quinacridone derivative, pyrrolopyridine derivative, thiazolopyridine derivative, cyclopentadiene derivative, styrylamine derivative, aromatic dimethylidyne compound and 8-quinolinol derivative, and polymer compounds such as polythiophene, polyphenylene and polyphenylenevinylene. The thickness of the light emitting layer is not particularly limited, however, it is usually in the range of preferably from 1 nm to 5 μm, more preferably from 5 nm to 1 μm, still more preferably from 10 nm to 500 nm.

The method for forming the light emitting layer is not particularly limited and a resistance heating evaporation method, an electron beam method, a sputtering method, a molecular lamination method, a coating method (e.g., spin coating, casting, dip coating) or an LB method may be used. Of these, a resistance heating evaporation method and a coating method are preferred.

The material for the hole injecting layer or hole transporting layer may be any as far as it has any one of a function of injecting holes from the anode, a function of transporting holes and a function of blocking electrons injected from the cathode. Specific examples thereof include electrically conductive high molecular oligomers such as carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styrylanthracene derivative, fluorenone derivative, hydrazone derivative, stilbene derivative, silazane derivative, aromatic tertiary amine compound, styrylamine compound, aromatic dimethylidyne-based compound, porphyrin-based compound, polysilane-based compound, poly(N-vinylcarbazole) derivative, aniline-based copolymer, thiophene oligomer and polythiophene. The hole injecting layer and the hole transporting are not particularly limited with respect to the thickness, however, the thickness is usually in the range of preferably from 1 nm to 5 $\mu$m, more preferably from 5 nm to 1 $\mu$m, still more preferably from 10 nm to 500 nm. The hole injecting layer and the hole transporting layer each may have a single layer structure comprising one or more of the above-described materials or may have a multi-layer structure comprising a plurality of layers which are the same or different in the composition.

The hole injecting layer and the hole transporting layer each is formed by a vacuum evaporation method, an LB method or a method of dissolving or dispersing the above-described hole injecting and transporting agent in a solvent and coating the solution (e.g., spin coating, casting, dip coating). In the case of the coating method, the material can be dissolved or dispersed together with a resin component. Examples of the resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin and silicone resin.

The material for the electron injecting layer or electron transporting layer may be any as far as it has any one of a function of injecting electrons from the cathode, a function of transporting electrons and a function of blocking holes injected from the anode. Specific examples thereof include heterocyclic tetracarboxylic acid anhydrides such as triazole derivative, oxazole derivative, oxadiazole derivative, fluorenone derivative, anthraquinodimethane derivative, anthrone derivative, diphenylquinone derivative, thiopyran dioxide derivative, carbodiimide derivative, fluorenylidenemethane derivative, distyrylpyrazine derivative and naphthalene perylene, and various metal complexes such as metal complex of phthalocyanine derivative or 8-quinolinol derivative, and metal complex containing metal phthalocyanine, benzoxazole or benzothiazole as a ligand. The electron injecting layer and the electron transporting layer are not particularly limited with resepct to the thickness, however, the thickness is usually in the range of preferably from 1 nm to 5 $\mu$m, more preferably from 5 nm to 1 $\mu$m, still more preferably from 10 nm to 500 nm. The electron injecting layer and the electron transporting layer each may have a single layer structure comprising one or more of the above-described materials or may have a multi-layer structure comprising a plurality of layers which are the same or different in the composition.

The electron injecting layer and the electron transporting layer each is formed by a vacuum evaporation method, an LB method or a method of dissolving or dispersing the above-described electron injecting and transporting agent in a solvent and coating the solution (e.g., spin coating, casting, dip coating). In the case of the coating method, the material can be dissolved or dispersed together with a resin component. Examples of the resin component include those described for the hole injecting and transporting layer.

The material for the protective layer may any as far as it has a function of preventing a substance which accelerates deterioration of the device, such as moisture and oxygen, from entering the device. Specific examples thereof include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a monomer mixture containing tetrafluoroethylene and at least one comonomer, a fluorine-containing copolymer having a cyclic structure in the copolymer main chain, a water absorptive substance having a coefficient of water absorption of 1% or more, and a moisture-proofing substance having a coefficient of water absorption of 0.1% or less.

The method for forming the protective layer is not particularly limited and, for example, a vacuum evaporation method, a sputtering method, a reactive sputtering method, an MBE (molecular beam epitaxy) method, a cluster ion beam method, an ion plating method, a plasma polymerization method (high frequency exciting ion plating method), a plasma CVD method, a laser CVD method, a thermal CVD method or a gas source CVD method may be used.

The present invention is described in greater detail below by referring to the Examples, however, the present invention should not be construed as being limited thereto.

EXAMPLE 1

40 mg of poly(N-vinylcarbazole), 12 mg of PBD (2-(4-biphenylyl)-5-(4-tert-butylphenyl)-1,3,4-oxadiazole) and 1 mg of a compound shown in Table 1 were dissolved in 3 ml of 1,2-dichloroethane and the resulting solution was spin-coated on a rinsed ITO substrate. The organic thin film produced had a thickness of about 120 nm. On the organic thin film, a patterned mask was provided. Then, in an evaporation apparatus, magnesium: silver (10:1) were co-deposited to have a thickness of 250 nm and further silver was deposited to have a thickness of 300 nm.

A dc constant voltage was applied to the thus-obtained EL device to cause luminescence using ITO as the anode and Mg:Ag as the cathode by means of a source measure unit Model 2400 (manufactured by Toyo Technica KK). The luminance was determined by a luminance meter BM-8 (manufactured by Topcon KK) and the emission wavelength and chromaticity coordinate were determined by a spectrum analyzer PMA-11 (manufactured by Hamamatsu Photonics KK). Furthermore, the device fabricated was left standing under the conditions of 60° C. and 20% RH for 3 hours and then illuminated. Thereafter, the relative luminance (a value of luminance after aging expressed by a relative value taking the luminance immediately after the fabrication of the device as 100 (driving voltage: 12 V)) and the presence or absence of dark spots on the luminescent surface were evaluated. The results obtained are shown in Table 1.

TABLE 1

| Sample No. | Compound | Emission Wavelength, λmax (nm) | Chromaticity Coordinate (x, y) | Maximum Luminance (cd/m$^2$) | Relative Luminance after Aging | Generation of Dark Spots | Remarks |
|---|---|---|---|---|---|---|---|
| 1 | Comparative Compound A | 460 | 0.17, 0.19 | 240 | 54 | generated | Comparison |
| 2 | Comparative Compound B | 505 | 0.18, 0.24 | 120 | 38 | generated | Comparison |
| 3 | Comparative Compound C | 480 | 0.17, 0.19 | 330 | 47 | generated | Comparison |
| 4 | Compound 3 | 450 | 0.16, 0.13 | 1320 | 88 | none | Invention |
| 5 | Compound 5 | 452 | 0.16, 0.14 | 1200 | 91 | none | Invention |
| 6 | Compound 9 | 458 | 0.16, 0.15 | 1080 | 82 | none | Invention |
| 7 | Compound 10 | 450 | 0.16, 0.16 | 970 | 77 | none | Invention |
| 8 | Compound 11 | 460 | 0.16, 0.17 | 1020 | 80 | none | Invention |
| 9 | Compound 12 | 455 | 0.17, 0.16 | 830 | 75 | none | Invention |

Comparative Compound A:

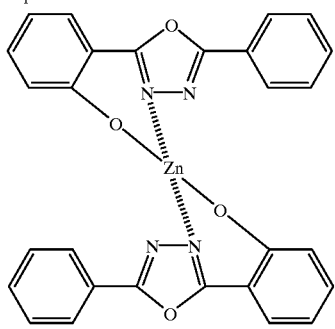

(Compound described in Preprint for 44th Joint Lecture relating to Applied Physics, p. 1152 (1997))

Comparative Compound B:

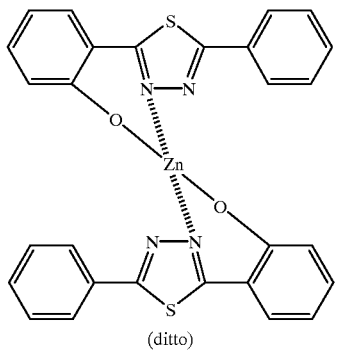

(ditto)

Comparative Compound C:

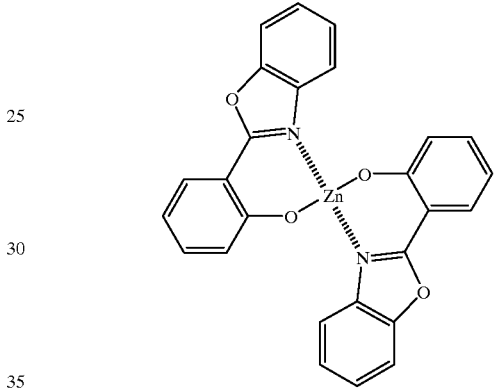

(Compound described in JP-A-7-133483)

As seen from the results in Table 1, when a metal complex of the present invention is used, a blue light emissive EL device having high color purity and excellent durability can be fabricated. In particular, good luminescence properties can be obtained even by a coating method which usually suffers from low luminance of light emitted.

EXAMPLE 2

Sample of the Invention:

40 mg of polyvinylcarbazole), 12 mg of PBD (2-(4-biphenylyl)-5-(4-tert-butylphenyl)-1,3,4-oxadiazole) and 60.5 mg of coumarin were dissolved in 4 ml of 1,2-dichloroethane and the resulting solution was spin-coated on a rinsed ITO substrate. At this time, the film thickness was about 80 nm. Subsequently, Compound 3 of the present invention was vacuum-deposited to have a film thickness of 40 nm under the conditions of from $10^{-5}$ to $10^{-6}$ Torr and a substrate temperature being room temperature. Thereafter, on the organic thin film formed of the compound of the present invention, a patterned mask was provided. Then, in an evaporation apparatus, magnesium: silver (10:1) were co-deposited to have a thickness of 250 nm and further silver was deposited to have a thickness of 300 nm.

The device obtained was illuminated at a driving voltage of 12 V and the luminance of light emitted was 1,800 cd/m$^2$.

From the results in the foregoing, it is seen that the metal complex of the present invention effectively functions as both a hole blocking agent and an electron transporting agent and useful for the fabrication of highly bright light emitting devices.

According to the present invention, an organic EL device capable of emitting blue light of high color purity and high luminance and having excellent durability can be obtained. In particular, good luminescence properties can be obtained even by a coating method which usually suffers from low luminance, accordingly, devices can be manufactured advantageously in view of the production cost.

While the invention has been described in detail and with reference to specific embodiments thereof, it will be apparent to one skilled in the art that various changes and modifications can be made therein without departing from the spirit and scope thereof.

What is claimed is:

1. An organic electroluminescence device comprising a pair of electrodes having formed therebetween a light emitting layer or a plurality of organic compound thin films including a light emitting layer, wherein at least one layer in the organic electroluminescence device comprises at least one of (i) a metal complex of a compound represented by formula (I) and a metal ion and (ii) a polymer comprising a residue of a compound represented by formula (I) which is a metal complex with a metal ion:

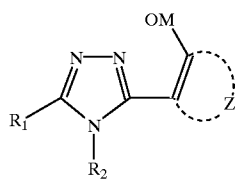

wherein $R_1$ represents a hydrogen atom or a substituent; $R_2$ represents a hydrogen atom, an aliphatic hydrocarbon group, an aryl group or a heterocyclic group; Z represents an atomic group necessary for forming a 5- or 6-membered ring; and M represents a hydrogen atom or a cation.

2. The organic electroluminescence device as claimed in claim 1, wherein the metal ion of the metal complex is a divalent or trivalent cation.

3. The organic electroluminescence device as claimed in claim 1, wherein the metal ion of the metal complex is $Be^{2+}$, $Mg^{2+}$, $Al^{3+}$, $Ga^{3+}$ or $Zn^{2+}$.

4. The organic electroluminescence device as claimed in claim 1, wherein $R_1$ and $R_2$ each represents an aryl group.

5. The organic electroluminescence device as claimed in claim 1, wherein the compound represented by formula (I) is represented by formula (I-b):

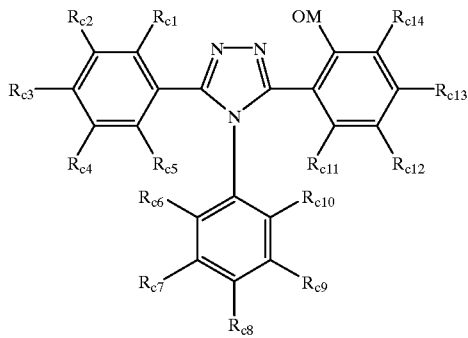

wherein M has the same meaning as M in formula (I); $R_{c1}$ to $R_{c14}$ each represents a hydrogen atom or a substituent, wherein the substituent represented by $R_{c1}$ to $R_{c14}$ has the same meaning as the substituent represented by $R_1$ of formula (I).

6. The organic electroluminescence device as claimed in claim 1, wherein at least one layer in the organic electroluminescence device comrises a metal complex of a compound represented formula (I) and a metal ion.

7. The organic electroluminescence device as claimed in claim 1, wherein at least one layer in the organic electroluminescence device comprises a polymer comprising a residue of a compound represented by formula (I) which is a metal complex with a metal ion.

8. The organic electroluminescence device as claimed in claim 7, wherein said polymer has a main chain, and the polymer contains a residue of the compound represented by formula (I) in its main chain.

9. The organic electroluminescence device as claimed in claim 7, wherein said polymer has a main chain, and the residue of the compound represented by formula (I) is connected to the main chain of the polymer.

10. The organic electroluminescence device as claimed in claim 1, wherein said substituent represented by $R_1$ is selected from the group consisting of: an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylarino group, a sulfamoyl group, a carbamoyl group, an alkythio group, an arylthio group, a sulfonyl group, a sulfinyl group, a ureido group, a phosphonamido group, a hydroxy group, a mercapto group, a halogen atom, a cyano group, a sulfo group, a carboxyl group, a nitro group, a hydroxamic acid group, a sulfino group, a hydrazino group, an imino group, and a heterocyclic group.

11. An organic electroluminescence device comprising a pair of electrodes having formed therebetween a light emitting layer or a plurality of organic compound thin films including a light emitting layer, wherein at least one layer in the organic electroluminescence device comprises a polymer having dispersed therein at least one of (i) a metal complex of a compound represented by formula (I) and a metal ion and (ii) a second polymer comprising a residue of a compound represented by formula (I) which is a metal complex with a metal ion:

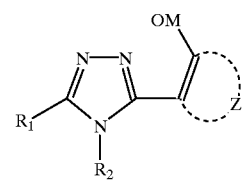

wherein $R_1$ represents a hydrogen atom or a substituent; $R_2$ represents a hydrogen atom, an aliphatic hydrocarbon group, an aryl group or a heterocyclic group; Z represents an atomic group necessary for forming a 5- or 6-membered ring; and M represents a hydrogen atom or a cation.

12. The organic electroluminescence device as claimed in claim 11, wherein the metal ion of the metal complex is a divalent or trivalent cation.

13. The organic electroluminescence device as claimed in claim 11, wherein the metal ion of the metal complex is $Be^{2+}$, $Mg^{2+}$, $Al^{3+}$, $Ga^{3+}$ or $Zn^{2+}$.

14. The organic electroluminescence device as claimed in claim 1 wherein $R_1$ and $R_2$ each represents an aryl group.

15. The organic electroluminescence device as claimed in claim 11, wherein the compound represented by formula (I) is represented by formula (I-b):

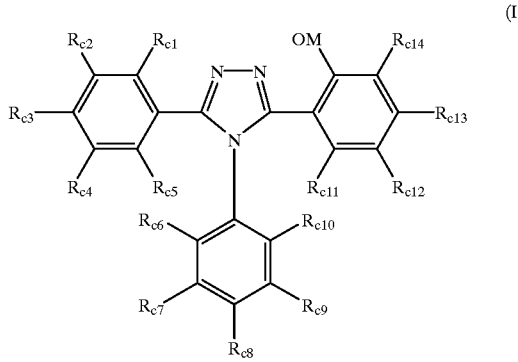

(I-b)

wherein M has the same meaning as M in formula (I); $R_{c1}$ to $R_{c14}$ each represents a hydrogen atom or a substituent, wherein the substituent represented by $R_{c1}$ to $R_{c14}$ has the same meaning as the substituent represented by $R_1$ of formula (I).

16. The organic electroluminescence device as claimed in claim 11, wherein at least one layer in the organic electroluminescence device comprises a polymer having dispersed therein a metal complex of a compound represented formula (I) and a metal ion.

17. The organic electroluminescence device as claimed in claim 11, wherein at least one layer in the organic electroluminescence device comprises a polymer having dispersed therein a second polymer comprising a metal complex of a residue of a compound represented by formula (I) and a metal ion.

18. The organic electroluminescence device as claimed in claim 17, wherein said second polymer has a main chain, and the second polymer contains a residue of the compound represented by formula (I) in its main chain.

19. The organic electroluminescence device as claimed in claim 17, wherein said second polymer has a main chain, and the residue of the compound represented by formula (I) is connected to the main chain of the second polymer.

20. The organic electroluminescence device as claimed in claim 11, wherein said substituent represented by $R_1$ is selected from the group consisting of: an alkyl group, an alkenyl group, an alkynyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkythio group, an arylthio group, a sulfonyl group, a sulfinyl group, a ureido group, a phosphonamido group, a hydroxy group, a mercapto group, a halogen atom, a cyano group, a sulfo group, a carboxyl group, a nitro group, a hydroxamic acid group, a sulfino group, a hydrazino group, an imino group, and a heterocyclic group.

* * * * *